United States Patent [19]

Willems

[11] Patent Number: 5,180,998
[45] Date of Patent: Jan. 19, 1993

[54] SWITCHED TRANSMISSION LINE PHASE SHIFTER APPARATUS EMPLOYING MULTIPLE JETS

[75] Inventor: David A. Willems, Salem, Va.

[73] Assignee: ITT Corporation, New York, N.Y.

[21] Appl. No.: 788,050

[22] Filed: Nov. 5, 1991

[51] Int. Cl.⁵ ............................................. H03H 11/20
[52] U.S. Cl. .................................. 333/164; 333/103; 307/571
[58] Field of Search ............... 333/138, 140, 156, 164, 333/103; 307/571, 304, 550, 568; 330/277, 310, 311

[56] References Cited

U.S. PATENT DOCUMENTS 4,893,035 1/1990 Reynolds et al. ............... 333/164 X
4,994,773 2/1991 Chen et al. ......................... 333/164

Primary Examiner—Paul M. Dzierzynski
Assistant Examiner—Seung Ham
Attorney, Agent, or Firm—Arthur L. Plevy

[57] ABSTRACT

A reflection-type phase shifter employs an artificial delay line which is constructed of high impedance transmission line sections for the series inductive elements in the transmission line. Each junction between inductances in the transmission line is associated with a separate FET pair. The FET pair includes a first FET having the source to drain path coupled between the junction and a point of reference potential. The gate electrode of the first FET is coupled via the source to drain path of a second FET to the point of reference potential. The gate electrode of the second FET is coupled to one terminal of a resistor which is of a larger value compared to the ON resistance of the FET. This resistor has another terminal coupled to a control voltage source. Each junction or tap between inductors is returned to ground through an additional circuit where the gate electrode of the second FET in each circuit is coupled to that resistor which is also coupled to the gate electrode of each first FET in the FET pair. In this manner, when a given FET is selected and biased ON to implement a given length line, each FET device which is further down the chain is also operated, based on the cascade arrangement of FETs. In circuit operation, each FET which is further down the chain automatically conducts due to the difference in the ON resistance of the FET as compared to the value of the above-noted resistor. The circuit eliminates the need for complex digital control by automatically switching all the FETs ON between the FET selected and the shorted end of the transmission line.

15 Claims, 2 Drawing Sheets

SWITCHED TRANSMISSION LINE PHASE SHIFTER APPARATUS EMPLOYING MULTIPLE JFETS

FIELD OF THE INVENTION

This invention relates to phase shifters in general and more particularly to switched transmission line phase shifter apparatus particularly adapted for microwave applications.

BACKGROUND OF THE INVENTION

The introduction of phased array antennas with the capability of beam steering and multiple beams have provided a major application of phase shifter and time delay networks used in the frequency microwave range. The ideal phase shifter network shifts the phase of the transmitted signal the same amount at all frequencies. The ideal time delay network delays the arrival of the signal at the output a specified amount of time. Both types of circuits can be used for beam steering. For pulse systems with short pulse lengths the transit time effects may demand the use of a more complex time delay circuit. Since no semiconductor component will alternate between a perfect short and a perfect open circuit the time delay or phase shifter circuit can be approximated only for over a limited frequency range.

The phase shifter or time delay circuit for microwave applications can be implemented with either a transmission or reflection type circuit. The transmission circuits can be realized as a (1) switched line circuit, (2) a low pass/high pass circuit, or (3) a loaded line circuit. The reflection circuit can be realized with either a circulator or a three dB coupler. At microwave frequencies the reflection circuit, which employs either a circulator or coupler, provides less insertion loss per degree of phase shift than any of the above-noted circuits. Such devices employ the minimum number of diodes or active devices per bit and any phase shift up to 180 degrees can be achieved. Also, the input match depends on the coupler or circulator rather than the diode switch or semiconductor device itself. However, the power handling capability of the coupler-type phase shifter is less than that obtained for the loaded line phase shifter.

A constant delay phase shifter utilizes an artificial transmission line constructed of high impedance transmission lines for the series inductive elements and field effect transistors (FETs) or diodes biased in the OFF state providing the shunt capacitance. This type of phase shifter operates by launching a signal down the artificial transmission line at the input end and allowing the signal to reflect back from a short at the output end. The circulator or coupler is required as indicated to separate the input signal from the output signal. Thus, the device operates to provide a phase shift proportional to twice that of the effective electrical length of the transmission line. The amount of the phase shift can be changed by changing the effective line length which is accomplished by a switching device, as for example, an FET or a PIN diode or other device, by turning it ON or OFF. Therefore an artificial transmission line fabricated using sixteen switching devices can provide sixteen 22.5° phase shift steps at the center frequency of a particular band. If thirty two switching devices were used, 11.25° phase shift steps at the band center frequency are obtained.

The reflection-type phase shifter, as described above, must isolate the input from the output. This is most commonly done with either the circulator or a 3 dB hybrid coupler. Such reflection-type phase shifters are known in the art and have been described in various publications. Many such reflection-type phase shifters use PIN diodes to operate as a switch to effectively short out sections of the transmission line. Either a PIN diode or a FET device can be employed at the junction or tap located between the inductances of the line. Practical FETs with large gate widths are required to insure low ON resistance which will therefore operate to produce an adequate short circuit. Large gate width FETs have relatively high OFF state capacitance which can make the construction of a reasonable impedance transmission line extremely difficult or if not impossible. As one can ascertain, most microwave systems use input and output impedances between 50 and 75 ohms for typical transmission lines and circuits.

The physical size of such FETs may prevent a practical implementation of an artificial transmission line utilized to accomplish the above-noted operation. A solution to this problem is to use smaller gate width FETs in parallel and turn more than one on which basically provides the same results as using a large FET. For example, if one biases or turns on four 150 micron gate width FETs rather than one 600 micron FET one achieves the same results as using the single larger FET. However, when small gate width FETs are operated in parallel then the effective resistance decreases, but the capacitance increases. This is not a good situation and creates further problems. Thus, to assure that the line is properly shorted at a selected tap all FETs not selected still have to be biased OFF or ON to assure reliable impedance values.

In order to obtain, for example, 16 or 32 phase shifts as described above, one needed a 16 or 32 bit word to implement a 4 or 5 bit control function. Therefore, the digital circuitry utilized to generate such words, as well as the decoders, was complex and involved additional cost.

According to the present invention there is described a circuit and control which eliminates complex digital circuitry by automatically switching all FETs at the transmission line taps to a fully conductive state between a selected FET at a given tap and the shorted end of the artificial transmission line. In this manner complex digital control circuits are eliminated, as well as efficient and reliable operation of the circuit configurations is provided.

BRIEF DESCRIPTION OF THE FIGURES

For a more complete understanding of the present invention, reference may be had to the following description of an exemplary embodiment considered in connection with the accompanying drawings, in which.

DETAILED DESCRIPTION OF THE FIGURES

Figure 1:
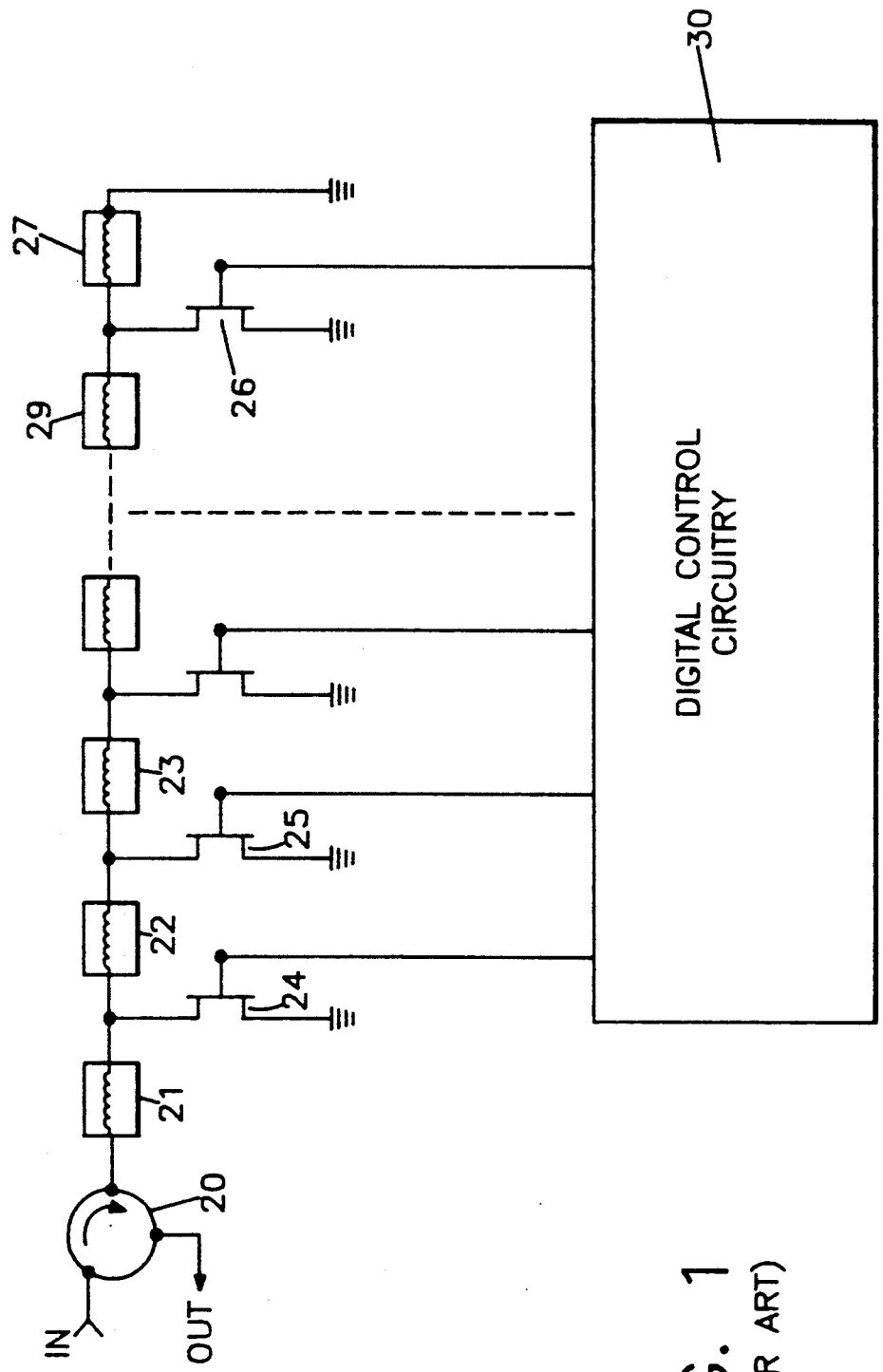
FIG. 1 is a block diagram partially in schematic form depicting a switched line phase shifter including high impedance transmission lines and utilizing FETs at the taps according to the prior art.

Referring to FIG. 1 there is shown a schematic partially in block form of a constant delay phase shifter which employs an artificial transmission line. The transmission line consists of high impedance transmission line section which implement the series inductive elements as 21, 22, 23 and 27. It is seen that the circuit has located at the input a circulator 20 which receives an input signal at one port and develops an output signal at a second port. One output port of the circulator 20 is connected to the input terminal of an inductive element or inductance 21 which may be formed from a high impedance transmission line. The other terminal of inductance 21 is connected to a terminal of another inductance 22 which is in turned connected in series with a third inductance 23 and so on, terminating in a last inductance 27 having the output terminal connected to ground. The junction between each inductance or transmission line tap is shunted to ground through a corresponding field effect transistor (FET). Thus the junction between inductances 21 and 22 is shunted to ground through the source drain path of FET 24. In a similar manner the junction between inductors 22 and 23 is shunted to ground through the source to drain path of FET 25 with the junction between inductors 29 and 27 shunted to ground through the source drain path of FET 26. Each FET as 24, 25 and 26, should preferably be of a large gate width to provide a low resistance when biased ON thus shorting the line or changing the length according to tap selection. Large gate width FETs have high OFF state capacitance as indicated and therefore the line impedance is too high for microwave applications. Using parallel smaller gate FETs provide a lower resistance but the capacitance increases as well. Thus the circuit shown in FIG. 1 is not reliable or practical at higher microwave frequencies.

The gate electrodes of the FETs 24, 25 and 26 are connected to a digital control circuit 30 which, as will be explained, operates to bias or turn the FETs ON or OFF. Essentially the phase shifter shown in FIG. 1 operates by launching a signal designated as input signal into the circulator at the input port. The circulator 20 then directs the signal down the artificial transmission line where the signal reflects back from the short at the end terminal of inductor 27. The circulator, as indicated, is required to separate the input signal from the output signal. Thus, the input signal is reflected back down the transmission line due to the short at the end of the line. The resulting phase shift is proportional to twice the effective electrical length of the transmission line. The phase shift valve can be adjusted by changing the effective length of the transmission line. This is accomplished by biasing any selected FET in the ON state. The FET basically, in its ON state, has a low resistance which approximates a short circuit. In the OFF state, the FET is represented by a capacitance which, as one can ascertain from FIG. 1, gives the typical transmission line circuit An artificial transmission line utilizing such FETs can be built and dependent upon the number of FETs and transmission line taps different phase shift steps can be provided. For example by employing sixteen FETs, one can provide sixteen 22.5° phase shift steps at the band center frequency which is equivalent to a four bit response. If thirty two FETs are used with thirty two taps, then 11.25° phase shift steps at the band center frequency which is a five bit response, is activated.

As above indicated, the FETs which are conventionally available for use with microwave frequencies, require a large gate width to insure a low conductive impedance to give an adequate short circuit operation. Large gate width FETs have relatively high off-state capacitance which can make the construction of a reasonable impedance transmission line very difficult especially at the impedances between 50 and 75 ohm. As indicated above, the solution to a problem is to use smaller gate width FETs and turn more than one ON which effects the same results as using a large FET. Thus one would parallel a number of FETs or n FETs in place of a single FET such as FET 24 and so on.

In order to change the effective length of the line, one then biases the selected FET in the ON state. In order to do this, one requires the digital control circuitry 30 to implement the requisite number of bits. The digital control circuitry 30 provides a 16 or 32 bit word for a 4 or 5 bit function. The FETs 24, 25 and 26 of the line, have to be properly biased to obtain a reasonable short at the selected tap. In this manner if one wished to reduce the effective length of the line an operating voltage would be applied to the gate electrode of FET 26 to turn FET 26 ON. By Biasing FET 26 ON one shorts out inductor 27 whereby the length of the line would be decreased by one section. FETs, as 24 and 25, would have to be biased in the OFF state in order to maintain transmission line operation to provide proper capacitance. Thus, one would have to control the effective length of the line by utilizing the digital control circuitry 30 to implement proper operation as to control sixteen, thirty-two or more FETs.

As one can understand, at microwave frequencies, one would employ MESFETs. Basically successful microwave field effect transistors are n-type gallium arsonide (GaAs) metal semiconductor field effect transistors. The source, gate and drain contacts or electrodes are fabricated from a metal so there is always a metal semiconductor junction at each of the contacts. The gate normally can include a Schottky barrier while the other two contacts are ohmic contacts. Different circuit configurations to implement such field effect transistors for microwave operations are quite well known. The use of such FETs for microwave applications have been described in various texts. See for example a text entitled "GaAs Integrated Circuits-Design and Technology" by Joseph Mun published by MacMillan Publishing Company of New York (1988). This text describes state of the art FET technologies employed in gallium arsenide and describes the various equivalent circuits of such devices as operating at microwave frequencies. The text describes MESFETS and other equivalent components.

It is also well known that one can fabricate inductive structures or transmission line structures on microwave circuits using stripline or microstrip configurations. Basically the fabrication of such inductive structures can be implemented by utilizing two ground plane conductors and one center conductor. Stripline can be utilized over microstrip and passive circuit applications where high precision, low dissipation and radiation loss and small dispersion are needed. Stripline, as well as microstrip and the ability to form accurate inductances on gallium arsenide or other substrates, is fairly well known in the art.

For examples of suitable inductive circuits which can be employed to formulate artificial transmission lines, as shown in FIG. (2), reference is made to a text entitled "Microwave Semiconductor Circuit Design" by W. Alan Davis published by Van Nostrand Reinhold Company (1984). Many other examples of both transmission lines, inductive circuits, as well as the fabrication of field effect devices for operation at microwave frequencies are well known and understood in the art.

Figure 2:
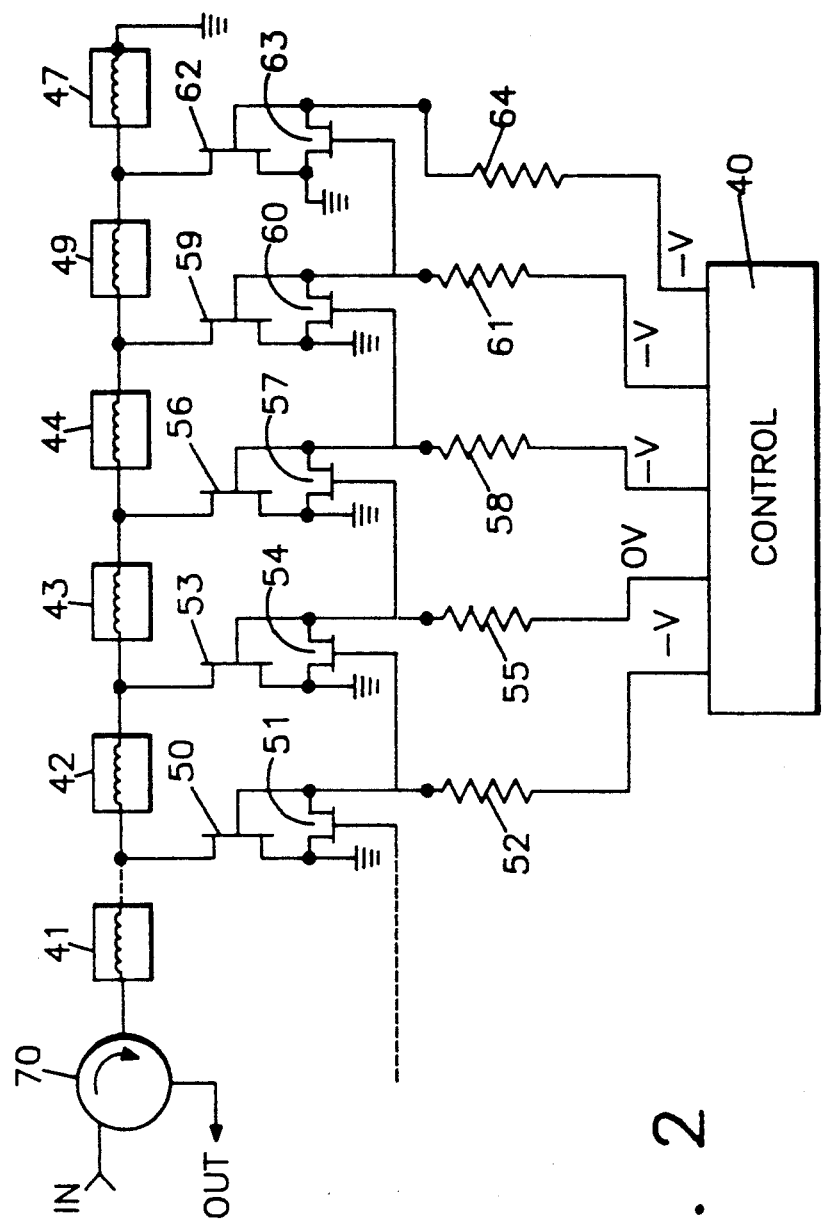
FIG. 2 is a schematic diagram partially in block form showing a section of a transmission line utilizing FETs located at the taps which operate in accordance with the present invention.

Referring to FIG. 2 there is shown a portion of a transmission line which operates according to the teachings of this invention and which eliminates the need for complex digital control circuitry as circuitry 30 shown in FIG. 1. The apparatus of FIG. 2 enables the use of accurate and reliable small gate width FETs without paralleling the same as described above and providing reliable operation. As will be explained, the transmission line apparatus operates with a suitable control module 40 which operates to automatically switch all the FETs to the ON state between the selected FET at a selected tap and the shorted end of the associated transmission line. The circulator 70 or other device essentially operates to isolate the input from the output in such a reflective switched line phase shifter. The inductances are shown in series and are fabricated as described above. The inductances consist of 41, 42, 43, 44, 49 and 47 where inductance 47 terminates at one terminal in ground. As seen, there is a dashed line indication between inductor 41 and inductor 42 as well as the gate electrode of FET 51 is shown dashed to indicate that the line can be of any length and include any additional number of devices and taps. Instead of a single FET returning each inductance tap or junction to a point of release potential or ground, there is a FET circuit employing a pair of FETs. For example, connected to one terminal of inductor 42, which is one tap of the transmission line, is a first FET 50. The first FET 50 has the source to drain path connected to ground and the gate electrode connected to the source or drain electrode of a second FET 51. The FET 51 has the source to drain path coupled between the gate electrode of FET 50 and the point of reference potential. The junction between the gate electrode and the source electrode of FETs 50 and 51 is connected to one terminal of a resistor 52, having the other terminal directed to a control source or bias voltage source 40. In a similar manner, the junction or tap formed between inductors 42 and 43 is coupled to ground or reference potential through the source to drain path of FET 53. The FET 53 has its gate electrode coupled to ground through the source to drain path of an additional FET 54. The gate electrode of FET 54 is coupled to one terminal of resistor 52. The gate electrode of FET 53, which is connected to the source electrode of FET 54, is coupled to the control module 40 through an additional resistor 55.

In a similar manner, the junction between inductors 43 and 44 is coupled to the exact type of FET circuit as described above, which includes FET 56 and FET 57 with the gate electrode of FET 57 coupled to one terminal of the resistor 55 and with the gate electrode of FET 56 coupled via resistor 58 to the control module 40. The entire line, as one can see, is implemented in exactly this way where the junction or tap between inductances 44 and 49 is coupled to FETs 59 and 60 where the gate electrode of FET 60 is coupled to one terminal of resistor 58, where the gate electrode of FET 59 is coupled to the control module via resistor 61, and so on. In this manner, as will be explained, when one selected FET is turned ON the FETs between the one switched ON and the shorted end of the line will also turn ON in a cascaded fashion. Additionally, none of the FETs which are to remain in the OFF state will change states.

Let us assume that there is a zero voltage applied to the gate electrode of FET 53 by applying zero volts to one terminal of resistor 55 from control module 40. Let us also assume that the control module 40 applies a negative voltage to each of the other gate electrodes, as $-V$ which is applied via the respective resistors. Thus, the gate electrode of FET 50 receives $-V$ via resistor 52, the gate electrode of FET 56 receives $-V$ via resistor 58, the gate electrode of FET 59 receives $-V$ via resistor 61, while the gate electrode of FET 62 receives $-V$ via resistor 64. The magnitude of $-V$ can, for example, be 4 volts on MESFETs of the depletion type.

As seen from the circuit, the following operation occurs. When zero volts are applied to the gate electrode of FET 53 the FET 53 conducts and thus shorts the terminal or tap between inductors 42 and 43 to ground. Because the gate electrode of FET 53 is at ground then the gate electrode of FET 57 is also at ground. Thus FET 57 conducts which switches the gate electrode of FET 56 to ground causing FET 56 to conduct and thus shorting the junction between inductors 43 and 44 to ground. In a similar manner, when FET 56 is at ground, then FET 60 in turn has the gate electrode coupled to ground. This turns ON FET 59 to short the junction between inductors 44 and 49 to ground and so on. This operation occurs because the ON resistance of the FETs is much less than the magnitude of resistors as 52, 55, 58, 61 and 64 and so on. Thus when the gate electrode of a selected FET is biased at ground via the series resistor, the FET turns ON. Due to the larger value of the series resistor as compared to the ON resistance of the FET additional FETs turn on. The turning ON of a FET then causes the sequence to repeat for all FETs which are below the selected FET in the chain. Thus, essentially, all terminals or junctions between inductors are shorted to ground from the selected FET to the right or towards the shorted end of the line. With a control voltage of zero volts applied via resistor 55, FET 53 conducts placing the junction between inductors 42 and 43 at ground. In a similar manner, the sequence repeats and the FETs to the right of FET 53 turn ON in a cascade fashion. Thus, the junction between inductors 43 and 44 goes to ground, as does the junction between inductors 44 and 49, as does the junction between inductors 49 and 47. It is also apparent that FET 50 remains in the OFF state and all FETs to the left of FET 53 also remain in the OFF state. The FET 50 remains in the OFF state and is completely unaffected by the changing of the voltage at the gate electrode of FET 53 because FET 54 provides complete isolation. Thus the turning ON of all FETs at all junctions to the right or towards the shorted end of the line assures a very low impedance short as the FETs essentially operate in parallel for the ON condition and provide a low capacitance in the OFF state. The capacitance in the OFF state is only the capacitance of a single smaller gate (150 micron) FET.

The resulting phase shifter provides better performance and eliminates complex digital control circuitry. The control voltage, or control bias generator 40 merely has to provide a zero voltage or ground at the respective input terminal of the resistor associated with the FET to be controlled to thereby automatically short out the remainder of the line toward the shorted end. Hence, there is no need for a multiple bit digital control circuit 30 as evidenced by the prior art configuration shown in FIG. 1. The control 40 is simple while providing for extremely good isolation. In this manner the circuit lends itself to be manufactured as a microwave monolithic integrated circuit (MMIC). The control generator or control function module 40 is extremely simple to implement as it operates to change one bit for any effective length of line and can be manufactured and fabricated on a common integrated circuit substrate. The above circuit can operate reliably for microwave applications in the frequency range of 1.0 to 1006 Hz. The use of gallium arsenide substrates is preferred but other substrates can be used as well.

What is claimed is:

1. A switched phase shifter including:
   a transmission line including a plurality of inductive elements arranged in series from a first end to a second end of said line and having a first inductive element and subsequent inductive elements, said line including a first line junction between said first inductive element and a subsequent inductive element and a subsequent line junction between each of said subsequent inductive elements, wherein said first line junction is shunted to a point of reference potential by a first semiconductor element and each said subsequent line junction is shunted to a point of reference potential by a subsequent semiconductor element, wherein said first semiconductor element and each said subsequent semiconductor element operate as a capacitor in a first non-conducting state (OFF) and as a short circuit in a second conducting state (ON) wherein the length of said line can be selectively changed according to the semiconductor element which is biased ON, the improvement therewith, wherein each semiconductor element at said first line junction and each said subsequent line junction includes a FET pair including a first FET having a source, drain and gate electrode and having the source to drain path connected between a junction and a point of reference potential;
   a second FET having a source, drain and gate electrode, with said source to drain path coupled between said gate electrode of said first FET and said point of reference potential whereby each said subsequent line junction toward said second end of said line each includes an FET pair; and
   a resistor associated with each FET pair, said resistor having one terminal connected to said gate electrode of said first FET of said associated FET pair wherein said resistor has a larger impedance value than the effective ON resistance of said first FET of said associated FET pair, with the junction between said one terminal of said resistor and said gate electrode of said first FET of each said associated FET pair connected to said gate electrode of said second FET of said FET pair at said subsequent line junction toward said second end of said line, whereby each lien junction or tap between inductances is similarly connected; with each other terminal of each resistor associated with each said FET pair adapted to be connected to a control bias source whereby when a conducting bias is applied to said other terminal of a selected resistor associated with a selected first FET of a selected FET pair said selected first FET turns ON to turn ON said second FET at said subsequent junction towards said second end of said line which turns ON said first FET of said FET pair at said subsequent junction, whereby all FETs at all junctions between said selected turned ON FET and said second end of said line are turned ON, with all FET pairs positioned after said selected FET pair towards said first end of said line remaining in said OFF state and appearing as a capacitor, whereby the length of said line is changed by applying a single operating ON bias via said resistor to only one FET pair located at a line junction selected according to said desired line length.

2. The switched phase shifter according to claim 1 wherein said phase shifter is of the reflective type having an input means coupled to said first end of said line for receiving an input signal which is launched down said line to said second end, said second end terminated in a short circuit, whereby said input signal is reflected back from said second end to said input means to provide a delayed output signal having a phase shift approximately equal to twice the electrical length of said line and where each junction or tap of said line can be selectively shorted via said FET pairs to vary said length and therefore said phase.

3. The switched phase shifter according to claim 1 wherein said inductances are high impedance transmission line elements fabricated on an integrated circuit substance.

4. The switched phase shifter according to claim 1 wherein said FETS are MOSFETs.

5. The switched phase shifter according to claim 1 wherein said FETs are MESFETs.

6. The switched phase shifter according to claim 1 wherein said FETs are fabricated on an integrated circuit substrate.

7. The switched phase shifter according to claim 6 wherein said substrate is GaAs.

8. The switched phase shifter according to claim 2 wherein said input means is a circulator having an input port adapted to receive an input signal, a first output port coupled to said first end of said line and a second output port for propagating said reflected signal.

9. The switched phase shifter according to claim 1 wherein said line has sixteen junctions sixteen 22.5 degree phase shifts at the center of a selected frequency band.

10. The switched phase shifter according to claim 1 wherein said line has thirty two junctions to provide thirty two 11.25 degree phase shifts at the center of a selected frequency band.

11. The switched phase shifter according to claim 1 wherein said FETs are depletion type FETs.

12. The switched phase shifter according to claim 1 wherein said conducting bias voltage (ON) applied to said other terminal of said resistor is relatively at ground potential, with said OFF bias voltage having a negative potential.

13. The switched phase shifter according to claim 1 wherein said transmission line and said FET pairs are fabricated utilizing microwave monolithic integrated circuit techniques.

14. The switched phase shifter according to claim 1 wherein said first and second FETS have gate widths of approximately 150 microns.

15. The switched phase shifter according to claim 8, wherein said transmission line has an input and output impedance between 50–75 ohms.

* * * * *

UNITED STATES PATENT AND TRADEMARK OFFICE
CERTIFICATE OF CORRECTION

PATENT NO. : 5,180,998
DATED : January 19, 1993
INVENTOR(S) : David A. Willems

It is certified that error appears in the above-indentified patent and that said Letters Patent is hereby corrected as shown below:

On the title page: Item [54] and Column 1, line 2, after "MULTIPLE" delete "JETS" and insert _--FETS --.

Signed and Sealed this

Twenty-sixth Day of October, 1993

Attest:

BRUCE LEHMAN

Attesting Officer

Commissioner of Patents and Trademarks